United States Patent [19]

Weber et al.

[11] Patent Number: 5,260,377

[45] Date of Patent: Nov. 9, 1993

[54] CROSSLINKABLE CARBOSILANE POLYMER FORMULATIONS

[75] Inventors: William P. Weber, Los Angeles, Calif.; Raymond T. Leibfried, Newark, Del.; Xiugao Liao, Los Angeles, Calif.

[73] Assignees: University of Southern California, Los Angeles, Calif.; Hercules Incorporated, Wilmington, Del.

[21] Appl. No.: 972,250

[22] Filed: Nov. 5, 1992

Related U.S. Application Data

[63] Continuation-in-part of Ser. No. 840,513, Feb. 24, 1992, abandoned, which is a continuation-in-part of Ser. No. 758,638, Sep. 12, 1991, Pat. No. 5,171,810, which is a continuation-in-part of Ser. No. 636,639, Dec. 31, 1990, Pat. No. 5,169,916, and a continuation-in-part of Ser. No. 838,068, Feb. 18, 1992.

[51] Int. Cl.$^5$ ............................................. C08F 8/00
[52] U.S. Cl. ....................................... 525/105; 524/849; 524/855; 524/856; 524/858; 524/868; 524/789; 524/788; 524/103; 524/106; 524/431; 524/478; 524/477; 526/279; 528/15; 528/25; 528/21; 528/31

[58] Field of Search ................ 528/15, 25, 21, 31; 525/477, 478, 103, 105, 106, 431; 526/279; 524/849, 855, 856, 858, 868, 789, 788

[56] References Cited

U.S. PATENT DOCUMENTS

| | | | |
|---|---|---|---|
| 2,823,218 | 2/1958 | Speier et al. | 528/15 |
| 4,719,273 | 1/1988 | Seyferth et al. | |
| 4,741,966 | 5/1988 | Cavezzan | 528/15 |
| 4,877,820 | 10/1989 | Cowan | |
| 4,900,779 | 2/1990 | Leibfried | |
| 5,169,916 | 12/1992 | Weber et al. | 528/31 |
| 5,171,810 | 12/1992 | Weber et al. | 528/31 |

OTHER PUBLICATIONS

Zhou & Weber, Macromolecules 23:1915 (1990).
Weber et al., Polymer Preprints, 31:44 (1990).

*Primary Examiner*—Melvyn I. Marquis
*Attorney, Agent, or Firm*—Connolly & Hutz

[57] ABSTRACT

Crosslinkable carbosilane polymer formulations are prepared from saturated or unsaturated carbosilane polymers containing reactive silicon hydride radicals in the polymer chain combined with polycyclic polyene crosslinkers having two or more double bonds that are reactive in the hydrosilation crosslinking reaction.

23 Claims, No Drawings

CROSSLINKABLE CARBOSILANE POLYMER FORMULATIONS

This invention was made with Government support under Contract No. AFOSR-89-0007 by the Air Force Office of Scientific Research and Contract No. N00014-89-J-1961 by the Department of the Navy. The Government has certain rights in this invention.

This is a continuation-in-part of Ser. No. 840,513, filed Feb. 24, 1992, now abandoned, which is a continuation-in-part of Ser. No. 758,638, filed Sep. 12, 1991, now U.S. Pat. No. 5,171,810, which is a continuation-in-part of Ser. No. 636,639, filed Dec. 31, 1990, now U.S. Pat. No. 5,169,916 and is a continuation-in-part of Ser. No. 838,068, filed Feb. 18, 1992.

FIELD OF THE INVENTION

The field of this invention is crosslinkable polymer formulations. More specifically, the invention relates to crosslinkable carbosilane polymer formulations containing cyclic polyenes which crosslink the polymer by hydrosilation.

BACKGROUND OF THE INVENTION

Lammens et al., in Polymer Letters 9:341 (1971) teach the ring opening metathesis polymerization of 1,1-dimethyl-1-silacyclopent-3-ene. Further work along these lines was done by Finkel'shtein et. al., in Ivestiya Akademii Nauk SSR 3:641 (1981). Horvath and Chan first described the anionic ring opening polymerization of disubstituted 1-silacyclopentene monomers in J. Org. Chem. 20:4498 (1971).

Zhou and Weber taught the preparation of an unsaturated carbosilane polymer containing silicon hydride radicals, poly(1-methyl-1-sila-cis-pentene) in Macromolecules 23, 7, 1915–1917, 1990. The same authors described the ring opening polymerization of 2-methyl-2-silaindan to give poly(methylsilanediylmethylene-1-,2-phenylenemethylene) using butyl lithium and hexamethylphosphoramide in THF at $-78°$ C. (Makrol. Chem., Rapid Comm. 11, 19–24, 1990). The mechanism of ring opening polymerization of 1-methyl-1-silacyclopent-3-ene was discussed by Weber in Polymer Preprints 31, April 1990. Zhou et al. teach the anionic ring opening polymerization of 1-silacyclopent-3-ene in Polymer Bulletin 23, No. 5, May 1990.

U.S. Pat. No. 3,046,921 to Sommer teaches the ring opening polymerization of silacyclobutanes with hydrogen on the silicon atom. These silicon hydride bearing carbosilane polymers are reacted with water and bases to give siloxane crosslinked compositions.

A process for preparing preceramic polymers is disclosed by Seyferth et al. in U.S. Pat. No. 4,719,273, and U.S. Pat. No. 5,070,116, where it is disclosed that bimetallic compounds of ethylene and acetylene can be reacted with methyldichlorosilane to make carbosilane polymers which can then be pyrolyzed to make ceramics. There is no reference to cyclic carbosilane monomers made from 1,3-butadiene or carbosilane polymers derived by ring opening polymerization of these monomers. There is also no indication that desirable electronic properties such as low dielectric constant and low water absorbance can be obtained from carbosilane polymers based on butadienes.

SUMMARY OF THE INVENTION

The present inventors have discovered crosslinkable carbosilane polymer compositions which give superior electrical properties with lower dielectric constants and dissipation factors as well as low moisture absorptions that are desirable for electronic applications. The lower dielectric constant is important to promote signal integrity and speed of transmission in electronic devices. This is especially important in printed circuit board laminating resins which directly impinge on the performance of the conductors in the circuit. A low dielectric constant and low water absorption are important in encapsulating resins that protect integrated circuits (chips) from the atmosphere. The polymer formulations of this invention have excellent dielectric constants and water absorbance.

The invention is directed to formulations comprising at least one crosslinkable saturated or unsaturated carbosilane polymer containing silicon hydride radicals and one or more polycyclic polyene crosslinkers, and to formulations wherein polyene crosslinkers are used in connection with certain specific carbosilane polymers. The polycyclic polyene crosslinkers are cyclic hydrocarbon compounds containing two or more double bonds that are reactive in a hydrosilation reaction. The invention also provides for including a hydrosilation catalyst in the formulation.

In addition, this invention is directed to the above formulations containing fillers to the extent of about 90% by weight, and formulations containing known stabilizers or optionally containing elastomers for toughening the crosslinked polymers.

DETAILED DESCRIPTION OF THE INVENTION

The new and useful crosslinkable compositions of this invention are comprised of saturated or unsaturated carbosilane polymers bearing reactive silicon hydride groups in the polymer chain combined with polycyclic polyene crosslinkers. It was discovered that all parts of these compositions are compatible to give fluid formulations that are easily coated on substrates and readily crosslinked at about 110° C. to 260° C. to give a range of properties from glassy polymers to crosslinked elastomers when hydrosilation catalysts are added. The glassy crosslinked polymers have high glass transition temperatures and very good thermal stability. The elastomers are flexible and have low glass transition temperatures and are useful as low stress encapsulating coatings for electronic devices.

The glassy thermoset formulations can be cured at various temperature ranges, normally at 30°–40° C. above the desired glass transition temperature. The thermally promoted cure with a platinum hydrosilation catalyst can be started at 100° C. or higher where a semi-solid is formed after about 15 minutes. The cure is continued at 150° C. for about two hours giving a glass transition over 100° C. If the formulations are heated at 200°–250° C. for two hours, a glass transition temperature over 150° C. is achieved. This curing (crosslinking) scheme is especially effective with silacyclobutane polymer formulations containing silicon hydride and dicyclopentadiene as crosslinker, where the SiH groups of the polymer are approximately equal to the double bonds of the dicyclopentadiene and the platinum catalyst is present at 25–100 ppm.

Suitable unsaturated carbosilane polymers useful in this invention comprise repeating units having the following formula:

  5 where R is hydrogen, an alkyl radical containing from one to four carbon atoms or an aromatic radical; $R_1$ and $R_2$ are independently hydrogen, a methyl radical or halogen and n is an integer of at least 5, preferably about 10 to about 10,000. Exemplary saturated and unsaturated carbosilane polymers and copolymers and their preparation, and preparation of the monomers from which they are prepared, are described by Weber et al. in copending applications Ser. No. 07/636,639 filed Dec. 31, 1990, Ser. No. 07/758,638, filed Sep. 12, 1991, Ser. No. 07/757,281, now U.S. Pat. No. 5,130,390, and Ser. No. 07/838,068, filed Feb. 18, 1992 the full disclosure of which are incorporated herein by reference. As disclosed in the copending applications, the stereochemistry of the polymers can be controlled during their preparation. For example, the stereochemistry of the double bonds is entirely cis when anionic ring opening catalysts such as butyl lithium are used. The double bonds in the polymer chains are both cis and trans when metathesis catalysts such as tungsten chloride and tetraphenyl tin are used for ring opening polymerization.

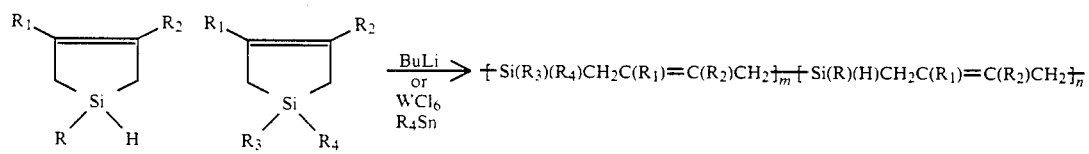

Silapentane polymers normally have cyclic terminal groups on the polymer chain with the following formula:

These groups can promote branching and crosslinking during the curing (crosslinking) reaction of the formulations of this invention.

It is believed that, under some conditions, the monomers may polymerize to make macrocyclic rings which may be present in the carbosilane polymers. These rings would participate in the crosslinking reaction and become part of the crosslinked network in the final, cured polymer.

A particularly preferred unsaturated polymer is poly(1-methyl-1-silapent-3-ene), represented in the above formula where R is methyl and $R_1$ and $R_2$ are hydrogen. Other preferred polymers are poly(1-phenyl-1-silapent-3-ene) and poly(1-silapent-3-ene) as described in the cited copending applications.

Generally, the polymers are made from silacyclopentene monomers polymerized by metathesis or anionic ring opening catalysts. One exemplary type of such monomer is represented by the formula:

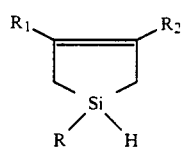

where R, $R_1$ and $R_2$ are defined as above. Preferred monomers within this general formula are 1-methyl-1-silacyclopent-3-ene, 1 phenyl-1-silacyclopent-3-ene, or 1-silacyclopent-3-ene. Alternately, the unsaturated carbosilane polymers may be prepared from two or more monomers polymerized in blocks or randomly from two or more different silicon hydride bearing silacyclopentene monomers or from silicon hydride bearing monomers combined with disubstituted silacyclopentene monomers with no silicon hydride groups.

Preferred comonomers with no silicon hydride groups for use in the copolymers described above are: 1,1-dimethyl-1-silacyclo-pent-3-ene, 1,1-diphenyl-1-silacyclopent-3-ene, and 1-methyl-1-phenyl-1-silacyclopent-3-ene.

Comethathesis or anionic copolymerization of two or more monomers is a desirable method for preparing the unsaturated copolymers of this invention. An exemplary copolymerization scheme is represented below:

where R is hydrogen, an alkyl radical containing 1 to 4 carbon atoms or an aromatic radical, $R_1$ and $R_2$ are independently hydrogen, a methyl radical, or halogen, and $R_3$ and $R_4$ are independently, an alkyl radical having from 1 to 4 carbon atoms or an aromatic radical, and m and n are integers of at least 5, and preferably wherein the ratio of m/n ranges from about 1/9 to 9/1.

When two or more silacyclopentene monomers are copolymerized, a wide range of properties can be realized. Using various combinations of 1,1-dimethyl-1-silacyclopent-3-ene, 1,1-diphenyl-1-silacyclopent-3-ene, and 1-methyl-1-silacyclopent-3-ene, the uncrosslinked polymers will normally have glass transition temperatures ranging from about $-60°$ C. to about $35°$ C. The crosslinked polymers formed by adding the crosslinking agent, as described herein, to various levels to these polymers can give either glassy thermoset polymers with a high glass transition temperature or flexible, cured elastomers with relatively low glass transition temperatures.

The thermoset compositions are usually rather low molecular weight polymers (2000–10,000 MW) with a high level of crosslinking where the silicon hydride content of the polymer is closely matched by the double bond content of the added polyene crosslinker, as described herein. The elastomeric compositions are relatively high molecular weight polymers ($>100,00$ MW) where the amount of crosslinking polyene added is relatively low (about 1 wt %) giving a cured, flexible elastomer with a low glass transition temperature (typically $<-20°$ C.). The glassy thermoset polymers and the flexible cured elastomers make excellent low polarity, water resistant coatings.

One type of cyclic carbosilane monomer undergoing anionic ring opening to form carbosilane polymers are represented by the general formula:

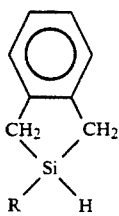

where R is hydrogen, an alkyl radical of 1 to 4 carbon atoms, or an aromatic radical. Preferred monomers of this type are 1-methyl-1-silaindan and 1-phenyl-1-silaindan. The monomers can be prepared by reacting o-xylene with n-butyl lithium and potassium t-butoxide and adding an appropriate dichlorosilane as described in Weber and Zhou in Makro. Chem., Rapid Comm., 11, 19-24 (1990). These monomers may be combined with one or more other monomers described herein to form copolymers. Use of these monomers will produce a carbosilane polymer represented by the following repeating units:

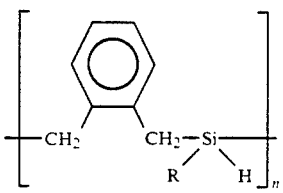

where R is hydrogen, an alkyl radical containing from one to four carbon atoms, or an aromatic radical; n is an integer from about 10 to about 10,000. Preferred are polymers where R is methyl or phenyl, namely, poly(1-methyl-1-silaindan) and poly(1-phenyl-1-silaindan). Carbosilane polymers of this type are more fully described by Weber in copending application Ser. No. 636,639, which is incorporated by reference.

Additional preferred carbosilane polymers are represented by the formula:

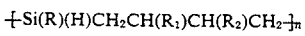

wherein R is hydrogen, an alkyl radical containing one to four carbon atoms or an aromatic radical, $R_1$ and $R_2$ are independently hydrogen, a methyl radical, or halogen, and n is an integer of at least 5, preferably about 10 to 10,000, or by the formula

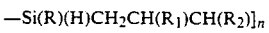

wherein R is hydrogen, an alkyl radical containing one to four carbon atoms or phenyl, $R_1$ and $R_2$ are independently hydrogen, a methyl radical, halogen or phenyl, and n is an integer of at least 5, preferably about 10 to 10,000, or by the formula

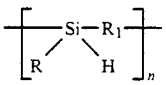

wherein R is hydrogen, an alkyl radical containing one to four carbon atoms, or an aromatic radical, $R_1$ is an aromatic radical, in each instance the aromatic radical preferably being phenyl, biphenyl or naphthyl, and n is an integer of at least 5, preferably about 10 to 10,000.

To prepare the compositions of the invention, the saturated or unsaturated carbosilane polymers or co-polymers are formulated with polyene crosslinking agents and optionally hydrosilation catalysts to make crosslinking formulations. Typically, the equivalent ratio of double bonds in the polyene crosslinker to silicon hydride groups in the carbosilane polymer component is about 0.7/1.0 to 1.3/1.0. The hydrosilation catalyst, if present, may be a soluble platinum or Group VIII metal complex as described in Advances in Organometallic Chemistry, Vol. 17, pg. 407. The metal is added at a concentration of 0.05% to 0.0005% of the total formulation. Preferred levels for soluble platinum complexes are 0.0005% to 0.005% of the crosslinking formulation. Although hydrosilation is the most common crosslinking reaction to occur, other crosslinking reactions can also occur, such as free radical crosslinking. Free radical crosslinking may be promoted by peroxides or azo compounds.

The carbosilane polymers bearing silicon hydride groups can be reacted with a polycyclic polyene such as dicyclopentadiene at a low temperature to react only the norbornene double bond to make an uncrosslinked prepolymer. It is preferred to make and store the compositions of the invention in the form of prepolymers for increased storage stability and lack of odor. Suitable low temperatures for forming the prepolymer are 40° to 100° C.

Depending upon the formulation, the material can be coated on substrates and cured at room temperatures or higher temperatures up to 280° C. (under inert atmosphere). The modulus and glass transition temperatures will vary considerably with the cure temperature. The examples below demonstrate typical glass transition temperatures of the cured polymer formulations.

A wide variety of polyenes can be used as the crosslinking polyene in the formulations of this invention. Most of the dienes are suitable with silapentene polymers, such as 1,3-butadiene, 2-methylbutadiene, 1,7-octadiene, or 2-chlorobutadiene. Unsaturated elastomers such as 1,2-polybutadiene and 1,2-polyisoprene can be used as the crosslinking polyene. Aromatic dienes such as divinylbenzene, diisopropenyl benzene, diallylbenzene, and other aromatic compounds with two or more vinyl radicals can be used in the crosslinking formulations of this invention. Siloxane based dienes such as 1,3-divinyl-1,1,3,3-tetramethyldisiloxane or diallyl disiloxanes can be used. Siloxane based polyenes can be used where cyclic or linear polysiloxane compounds bearing more than one vinyl radical are employed. Typically, dimethylsiloxane copolymers with vinyl methyl- or allylmethylsiloxane can be used as the crosslinking polyenes. Cyclic siloxanes bearing vinyl radicals are used preferentially since they are very low viscosity fluids with high compatibility in the formulations. Most preferred among the siloxane based polyenes is tetramethyltetravinylcyclotetrasiloxane. Branched and tetrasiloxanes such as tris(vinyldimethylsiloxy) silane and tetrakis (vinyldimethylsiloxy) silane are also preferred polyenes that are used in this invention.

Polymers of butadiene and substituted butadienes containing 1,2-polybutadiene blocks may be used as the polyene crosslinkers in this invention. The 1,2- polybutadiene blocks provide pendant vinyl groups which are reactive in the hydrosilation crosslinking reaction. Furthermore, the pendant vinyl groups cyclize thermally to provide cyclic structures that increase the glass transition temperature of the crosslinked carbosilane polymer formulation. This cyclization reaction is promoted by cation generators such as acids and Lewis acids. The cyclized elastomers may be classed as "polycyclic polyenes", as that term is used herein.

A preferred class of polyenes are polycyclic polyenes which have two or more double bonds reactive in a hydrosilation reaction. Preferred polycyclic polyene crosslinkers are represented by Diels-Alder adducts of cyclopentadiene, such as dicyclopentadiene, cyclopentadiene trimer and tetramer, bicycloheptadiene, bicycloheptadiene dimer and dimethanohexahydronaphthalene. Further examples of this general type are vinylnorbornene and ethylidene norbornene. The following U.S. patents disclose suitable polycyclic polyene crosslinkers: U.S. Pat. Nos. 4,900,779; 4,902,731; 5,124,423; 5,124,375; 5,013,809; 5,008,360; 5,068,303; 4,877,820. Each is incorporated by reference.

The formulations of this invention can be coated, molded, or compounded to make useful fabricated forms. Coating inorganic, glass, or metal under ambient conditions can provide corrosion protection for costly assemblies. The low polarity polymer formulations provide cohesive and adhesive coatings with very low propensity for the absorption of atmospheric moisture. This and the low dielectric constants make them excellent protective coatings for sensitive electronic parts.

The polymer formulations of this invention may be coated onto fibers to make composite laminates and fabricated into useful structures. The fluid formulations will coat glass, aramide or carbon fibers as filaments, mats or cloth and can be partially cured to provide forms which are easily processed into laminates or other composite forms, such as printed circuit board substrates.

The composition can be injected into a die or mold to provide rimtruded or molded parts directly. Typically, glass non-woven mats or cloth are placed in the mold and the fluid formulation is injected to fill the mold and cured in place to make the finished molded part. In the rimtrusion applications, glass or fiber roving is pulled through a die where the fluid polymer formulation is injected under pressure and cured thermally to make a rigid rod out of the roving before it leaves the heat zone of the rimtruder barrel. Rods, beams or other composite constructions can be made continuously by this process.

A number of additives can be incorporated into the polymers of this invention. Additives such as fillers, reinforcements, and pigments are readily incorporated. Carbon black, graphite fibers, aramide fibers, vermiculite, mica, wollastonite, calcium carbonate, silica, fused silica, fumed silica, glass spheres, glass beads, glass cloth, ground glass, and waste glass are examples of fillers which can be incorporated. Fillers can serve either as reinforcement or as fillers and extenders to reduce the cost of the molded product. Glass spheres are useful for preparing low density composites. Especially useful reinforcing fillers are spherical particles of fused silica which can be included up to about 95 weight %. Heat conducting ceramic fillers can be used up to about 90 wt. %. These are useful in electronic encapsulants to remove heat from electronic devices.

Stabilizers (antioxidants, antiozonants, thermal and light stabilizers) are useful to maintain the storage stability of the monomers, polymers, and the thermal oxidative stability of the final products. Among the preferred stabilizers are radical scavengers such as hindered phenols in combination with other stabilizers. Especially useful are the Tinuvin ® stabilizers available from Ciba-Geigy and the Naugard ® stabilizers from Uniroyal Chemical.

One or more elastomers can also be added, preferably prior to crosslinking, to improve toughness by incorporating elastomeric domains into the formulation. Preferred are hydrocarbon elastomers having a molecular weight of less than 100,000 and low molecular weight siloxane elastomers. Exemplary hydrocarbon elastomers are low molecular weight ethylene-propylenediene terpolymers, low molecular weight butyl rubber, partially hydrogenated low molecular weight polyisoprene or natural rubber, and partially hydrogenated low molecular weight polybutadiene or styrene-butadiene copolymers. Exemplary siloxane rubbers include low molecular weight vinyl or SiH terminated polydimethyl/diphenyl siloxane copolymers. Preferred are low molecular weight ethylene-propylene-dicyclopentadiene and ethylene-propylene-ethylidene-norbornene polymers having a molecular weight of 5500 to 7000. Most preferred is Trilene 67 elastomer (available from Uniroyal Chemical Co.). The elastomer or elastomers are generally used in an amount of 0.5 to 20%, preferably 3 to 12%, and most preferably 5 to 10%, by weight of the total composition; higher levels may be useful in some applications. Generally, such elastomers can be employed as disclosed in copending U.S. application Ser. Nos. 593,161, filed Oct. 5, 1990, and 685,360, filed Apr. 15, 1991, now U.S. Pat. No. 5,171,817.

Thermoplastic polymers such as polyethylene, polypropylene, polysulfone, or polycarbonate may be added to form a separate phase giving a toughened, cured carbosilane polymer formulation.

The following examples are presented as illustration and not as limitation. Unless noted otherwise, all percentages and parts are by weight.

EXAMPLE 1

Preparation of 1-phenyl-1-silacyclobutane 60g (0.34 mole) dichlorophenylsilane and 20 mg $H_2PtCl_6H_2O$ was placed into a dry 250 ml three neck round bottom flask equipped with a dropping funnel and condenser with nitrogen inlet system. With stirring, 39 g (0.51 mole) of allyl chloride was added dropwise of 2 h at room temperature. The mixture was refluxed for an additional 24 h. After removing low boiling point compounds, the mixture was distilled by reduced pressure to collect 8 g 90°–105° C./4–5 mm Hg and 46 g 125°–127° C./4–5 mm Hg. The second fraction is (3-chloropropyl)phenyldichlorosilane.

A dry 1 L three neck round bottom flask equipped with a mechanical stirrer, dropping funnel, and condenser with nitrogen inlet system was charged with 18.3 g (0.75 mole) magnesium powder and 250 ml anhydrous diethyl ether. The magnesium was activated by the addition of 200 mg iodine. And then 50.7 g (0.20 mole)(3-chloropropyl)phenyldichlorosilane in 100 ml diethyl ether was added dropwise over 40 mins. at room temperature. The mixture was stirred for an additional 48 h and 200 ml anhydrous diethyl ether was added. The magnesium chloride and excess magnesium was filtered under nitrogen. The solid was washed with three portions of ether. The solvent was removed by the distillation and the product was distilled by reduced pressure. 22 g of 1-chloro-1-phenyl-1-silacyclobutane b.p. 83°–85° C./2 mm Hg was obtained.

The 1-chloro-1-phenyl-1-silacyclobutane was reacted with lithium aluminum hydride in ethyl ether to obtain 1-phenyl-1-silacyclobutane. The 1-chloro-1-phenyl-1-silacyclobutane (8.4 g, 46 mmole) in 10 ml diethyl ether was added dropwise to 0.87 g 23 mmole of lithium aluminum hydride in 10 ml diethyl ether at ±5° C. The reaction mixture warmed gradually to room temperature. The mixture was stirred over 12 hours. The mixture was hydrolyzed with 3N hydrochloric acid. After separation, the water layer was extracted with 2×20 ml of ethyl ether. The combined organic layer was dried over anhydrous sodium sulfate. Removal of solvent and fractional distillation gave 1-phenyl-1-silacyclobutane. b.p. 70°–72° C./20 mm Hg, 6.3 g, 92% yield was obtained. $^1$H NMR ($\delta$) 1.39 (m, 4H), 2.31 (m, 2H), 5.25 (m, 1H), 7.46 (m, 3H), 7.70 (m, 2H). $^{13}$C NMR ($\delta$) 12.71, 19.67, 127.98, 129.88, 134.35, 135.19, $^{29}$Si NMR ($\delta$) −1.80.

EXAMPLE 2

1-Methyl-1-silacyclobutane

1-Methyl-1-silacyclobutane was prepared in three steps from methyldichlorosilane and allyl chloride following example 1 procedures (1-methyl-1-silacyclobutane NMR analyses). $^1$H NMR ($\delta$) 0.27 (d, 3H, J=3.6 Hz), 0.86 (m, 2H), 1.02 (m, 2H), 2.04 (m, 2H), 4.61 (m, 1H). $^{13}$C NMR ($\delta$) −2.37, 12.63, 19.69. $^{29}$SiNMR($\delta$) 0.11.

EXAMPLE 3

Poly(1-Methyl-1-silacyclobutane)

In a 100 mL rb flask equipped with a Teflon covered magnetic stirring bar and rubber septum was placed 1-methyl-1-silacyclobutane (1.00 g, 11.6 mmol), THF (40 mL) and HMPA (200 μL). The mixture was cooled to −78° C. and a hexane solution of n-butyllithium (80 μL, 2.5M, 0.2 mmol) was added via a syringe. The reaction mixture was stirred at −78° C. for 2 h. A saturated solution of aqueous ammonium chloride (15 mL) was added. The organic layer was separated, washed with water (20 mL), dried over anhydrous magnesium sulfate, filtered and the volatile solvents removed by evaporation under reduced pressure. The residue was dissolved in a minimum amount of THF and the polymer was precipitated from methanol. This process was repeated twice. The polymer was dried under vacuum. In this way, 0.65 g 65% yield of poly(1-methyl-1-silcyclobutane), $M_w/M_n = 4,000/2,550$ was obtained. Tg=−89° C. $^1$H NMR ($\delta$)0.20 (d, 3H, J=3.5 Hz), 0.65 (m, 4H), 1.42 (m, 2H, J=8.1 Hz), 3.75(m, 1H, J=3.5 Hz). $^{13}$C NMR($\delta$) −6.23, 16.90, 19.76. $^{29}$Si NMR($\delta$) −11.46. IR(v) 2957, 2914, 2877, 2853, 2794, 2105, 1450, 1410, 1335, 1251, 1215, 1142, 1081, 1025, 985, 946, 925, 877, 832, 721 cm$^{-1}$ $C_4H_{10}Si$ Calc. C; 55.78, H; 11.70. Found C; 56.28, H; 11.57.

EXAMPLE 4

Poly(1-Phenyl-1-silabutane)

Using the same procedure described in example 3 above, 1-phenyl-1-silacyclobutane (1 g, 6.76 mmol), HMPA 200 μL, and n-butyllithium 80 μL, (2.5M, 0.20 mmol) in THF 40 mL. 0.8 g 80% yield of poly(1-phenyl-1-silabutane), $M_w/M_n = 2,050/1,700$ was obtained. $^1$H NMR($\delta$) 1.10 (m, 4H), 1.60 (m, 2H), 4.31, 4.42, 4.51 (m, 1H), 7.501 (m, 3H), 7.677 (m, 2H). $^{13}$C NMR($\delta$) 11.55, 11.58, 13.74, 13.88, 14.34, 14.40, 14.43, 14.70, 14.91, 15.83, 15.86, 17.88, 17.99, 18.91, 19.18, 19.61, 19.73, 19.61, 20.31, 26.19, 26.66, 127.77, 127.84, 129.07, 129.13, 129.20, 134.50, 134.58, 135.61, 135.84. $^{29}$Si NMR($\delta$) −14.94, −14.48, −12.48, −12.43, −12.31, −11.69, −11.47, −11.34, −11.06, −10.61, −10.57, −10.12, −10.08. IR (v) 3068, 3049, 3012, 2999, 2955, 2917, 2986, 2792, 2109, 1486, 1456, 1428, 1409, 1335, 1234, 1214, 1140, 1113, 1082, 1067, 1028, 998,983,944,810, 734, 699 cm$^{-1}$ $C_9H_{12}Si$ Calc. C; 72.94, H; 8.16. Found C; 72.59, H; 8.45.

EXAMPLE 5

Crosslinking Poly(1-phenyl-1-silacyclobutane) with Dicyclopentadiene

A mixture of 0.0709 grams of poly(1-phenyl-1-silacyclobutane) and 0.0318 grams of dicyclopentadiene was catalyzed by adding 0.0036 g of PC 075 (Huls America) platinum complex solution (0.303% Pt). The mixture was applied to a ceramic supported sensor and placed in a Dupont Dielectric Analyzer. After curing to 150° C. (2 hrs) the crosslinked polymer had a dielectric constant of 2.15 (1 KHz) and a dissipation factor 0.0063 (1 KHz).

EXAMPLE 6

Crosslinking Poly(1-phenyl-1-silabutane) with 1,7-Octadiene

A mixture of 0.1152 grams of poly(1-phenyl-1-silabutane) and 0.0428 grams of 1,7-octadiene catalyzed by 0.0059 grams of PC075 (Huls America) platinum complex solution was coated on a sensor and placed in a Dupont Dielectric Analyzer. After curing at 110° C. for four hours in a nitrogen atmosphere, the dielectric constant of the cured formulation was 2.37 KHz) and the dissipation factor was 0.0034 (1 KHz) at 30° C.

EXAMPLE 7

Crosslinking Poly(1-methyl-1-silacyclobutane) with Dicyclopentadiene

A mixture of 0.0639 grams poly(1-methyl-1-silacyclobutane) and 0.0490 grams dicyclopentadiene was catalyzed by 0.0038 grams PC 075 (Huls America) platinum complex solution (0.303% Pt). After curing at 155° C. (2 hr) the crosslinked polymer had a dielectric constant of 2.13 (at 155° C.) and a dissipation factor of 0.0010 (at 155° C.), determined at 10 KHz on a Dupont Dielectric Analyzer. After further curing at 260° C./4 hr the crosslinked polymer had a glass transition temperature of 154° C. measured by dielectric analysis at 0.1 Hz. The cured polymer has a 10% weight loss in air at 400° C. determined by thermogravimetric analysis (Dupont Thermoanalyzer) at 20° C./min. leaving a 54.5% residue at 1000° C. The corresponding 10% weight loss in nitrogen was at 480° C. leaving a 50.2% residue at 1000° C.

EXAMPLE 8

Crosslinking Copolymer of 1-Methyl-1-Phenyl-1-Silacyclopent-3-ene and 1-Phenyl-1-Silacyclopent-3-ene with Dicyclopentadiene A mixture of 0.1041 grams of titled copolymer, prepared as described in copending Ser. No. 758,638, and 0.0115 grams dicyclopentadiene was catalyzed by 0.0011 grams of PC 075 (Huls America) platinum complex solution (0.303% Pt). The catalyzed mixture was coated on a sensor and placed in a Dupont Dielectric Analyzer and cured at 110° C. for four hours. The dielectric constant of the crosslinked polymer was 2.37 (1 KHz) and the dissipation factor was 0.0089 (1 KHz) at 30° C.

EXAMPLE 9

Crosslinking Copolymer of 1-Methyl-1-Phenyl-1-Silacyclopent-3-ene and 1-Phenyl-1-Silacyclopent-3-ene with 1,3-Divinyl-1,1,3,3-Tetramethyldisiloxane A mixture of 0.1416 g of titled copolymer and 0.0208 g of 1,3-divinyl-1,1,3,3-tetramethyldisiloxane (Huls America D6210) was catalyzed by 0.0045 g PC075 (Huls America) platinum complex solution (0.303% Pt). The catalyzed mixture was coated on a sensor and placed in a Dupont Dielectric Analyzer and cured at 110° C. for four hours in a nitrogen atmosphere. The dielectric constant of the crosslinked formulation was 2.48 (1 KHz) and the dissipation factor was 0.0064 (1 KHz) at 30° C.

EXAMPLE 10

Crosslinking Poly(1-methyl-1-H-1-sila-3,4-benzopentene) With Dicyclopentadiene

The preparation of poly(1-methyl-1-H-1-sila-3,4-benzopentene) is found in application Ser. No. 636,639, Example 1. A mixture of 0.1481 g of poly(1-methyl-1-H-1-sila-3,4-benzopentene) and 0.066 g of dicyclopentadiene was catalyzed by 0.0059 g of PC 075 (Huls America) platinum complex solution (0.303% Pt). The catalyzed mixture was crosslinked in a nitrogen blanketed oven at 150° C. for two hours and 200° C. for two hours to give a clear, hard crosslinked polymer.

EXAMPLE 11

Crosslinking Poly(1-methyl-1-sila-1-ylidene-1,4-phenylene) With Dicyclopentadiene In a 2000 mL three necked rb flask, equipped with a rubber septum, an efficient reflux condenser, a pressure equalizing addition funnel and a Teflon covered magnetic stirring bar was placed magnesium (48.8 g, 2.03 mol) and THF (700 mL). With stirring, 1,4-dibromobenzene (200 g, 0.85 mol) in THF (200 mL) was added, dropwise, to this well-stirring reaction mixture. The reaction temperature was controlled by cooling with an ice-water bath. The reaction mixture was stirred at room temperature until the magnesium had almost completely disappeared. The mixture was refluxed over 30 min. And then, it was cooled to room temperature. A solution of methyldichlorosilane (92.6 g; 0.80 mol) in THF (100 mL) was dropped into this reaction mixture. The temperature was controlled by an ice-water bath. After this addition was finished, the mixture was refluxed for 1 hour. Ethyl ether (200 mL) and water (200 mL) were added. The organic layer was separated and aqueous layer was washed with 2×30 mL ether. The combined organic layers were washed with brine (200 mL). The organic layer was dried over anhydrous magnesium sulfate, filtered and the volatile solvents were removed by evaporation under reduced pressure. The residue was dissolved in a minimum amount of THF and the polymer was precipitated from methanol. This process was repeated twice. The polymer was dried under vacuum. In this way, a 90% yield of the desired polymer was obtained.

A mixture of 0.120 g of poly(1-methyl-1-sila-1-ylidene-1,4-phenylene) and 0.066 g dicyclopentadiene was catalyzed by 0.0059 g of PC 075 (Huls America) platinum complex solution (0.303% Pt). The catalyzed mixture was crosslinked in a nitrogen blanketed oven at 150° C. for two hours and 200° C. for two hours to give a hard glassy crosslinked polymer.

Having thus described the invention, the invention is defined in the following claims. All patents and documents cited herein are incorporated by reference.

What is claimed is:

1. A crosslinkable carbosilane polymer formulation comprising at least one carbosilane polymer containing silicon hydride radicals and at least one polycyclic polyene crosslinker containing more than one double bond which is reactive in a hydrosilation reaction, and optionally a hydrosilation catalyst.

2. The crosslinkable carbosilane polymer formulation of claim 1 wherein the carbosilane polymer is unsaturated and comprises repeating units having the following formula:

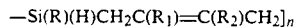
$$-Si(R)(H)CH_2C(R_1)=C(R_2)CH_2]_n$$

wherein R is hydrogen, an alkyl radical containing from one to four carbon atoms or an aromatic radical; $R_1$ and $R_2$ are independently hydrogen, a methyl radical, or halogen; and n is an integer of at least 5.

3. The crosslinkable carbosilane polymer formulation of claim 1 wherein the polymer is a random or block copolymer of the formula:

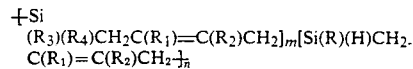
$$\{Si(R_3)(R_4)CH_2C(R_1)=C(R_2)CH_2]_m[Si(R)(H)CH_2C(R_1)=C(R_2)CH_2]_n\}$$

wherein R is hydrogen, an alkyl radical containing from one to four carbon atoms or an aromatic radical; $R_1$ and $R_2$ are independently hydrogen, a methyl radical or halogen; $R_3$ and $R_4$ are, independently, an alkyl radical containing from one to four carbon atoms or an aromatic radical; and m and n are integers of at least 5.

4. The crosslinkable carbosilane polymer formulation of claim 1 wherein the carbosilane polymer is saturated and comprises repeating units of the formula:

$$-Si(R)(H)CH_2CH(R_1)CH(R_2)CH_2]_n$$

where R is hydrogen, an alkyl radical containing from one to four carbon atoms or an aromatic radical; $R_1$ and $R_2$ are independently hydrogen, a methyl radical or halogen; and n is an integer of at least 5.

5. The crosslinkable carbosilane polymer formulation of claim 1 where the carbosilane polymer is comprised of one or more of the following repeating units:

$$\{Si(R)(H)CH_2CH(R_1)CH(R_2)\}_n$$

wherein R is hydrogen, an alkyl radical containing from one to four carbon atoms or phenyl. $R_1$ and $R_2$ are, independently, hydrogen, a methyl radical, halogen or phenyl, and n is an integer of at least 6. The crosslinkable carbosilane polymer formulation of claim 1 where the carbosilane polymer comprises repeating units of the formula:

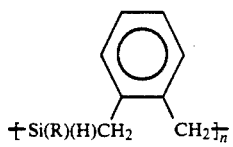

wherein R is hydrogen, an alkyl radical containing from one to four carbon atoms or an aromatic radical; and n is an integer from about 10 to about 10,000.

7. The crosslinkable carbosilane polymer formulation of claim 1 wherein the carbosilane polymer comprises repeating units of the formula:

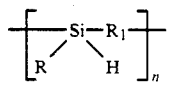

where R is hydrogen, alkyl having one to four carbon atoms, or an aromatic radical, $R_1$ is an aromatic radical, and n is an integer of at least 5.

8. The crosslinkable formulation of claim 1 where the polycyclic polyene is formed by a Diels-Alder reaction of cyclopentadiene.

9. The crosslinkable formulation of claim 1 wherein the polycyclic polyene crosslinker is selected from the group consisting of dicyclopentadiene, tricyclopentadiene, dimethanohexahydronaphthalene, bicycloheptadiene, tetracyclopentadiene, vinyl norbornene, and ethylidene norbornene.

10. The crosslinkable formulation of claim 2 wherein the polycyclic polyene crosslinker is selected from the group consisting of dicyclopentadiene, tricyclopentadiene, dimethanohexahydronaphthalene, bicycloheptadiene, tetracyclopentadiene, vinyl norbornene and ethylidene norbornene.

11. The crosslinkable formulation of claim 3 wherein the polycyclic polyene crosslinker is selected from the group consisting of dicyclopentadiene, tricyclopentadiene, dimethanohexahydro-naphthalene, bicycloheptadiene, tetracyclopentadiene, vinyl norbornene, and ethylidene norbornene.

12. The crosslinkable formulation of claim 4 wherein the polycyclic polyene crosslinker is selected from the group consisting of dicyclopentadiene, tricyclopentadiene, dimethanohexahydro-naphthalene, bicycloheptadiene, tetracyclopentadiene, vinyl norbornene, and ethylidene norbornene.

13. The crosslinkable formulation of claim 5 wherein the polycyclic polyene crosslinker is selected from the group consisting of dicyclopentadiene, tricyclopentadiene, dimethanohexahydronaphthalene, bicycloheptadiene, tetracyclopentadiene, vinyl norbornene and ethylidene norbornene.

14. The crosslinkable formulation of claim 6 wherein the polycyclic polyene crosslinker is selected from the group consisting of dicyclopentadiene, tricyclopentadiene, dimethanohexahydronaphthalene, bicycloheptadiene, tetracyclo-pentadiene, vinyl norbornene and ethylidene norbornene.

15. The crosslinkable formulation of claim 7 wherein the polycyclic polyene is selected from the group consisting of dicyclopentadiene, tricyclopentadiene, dimethanohexahydronaphthalene, bicycloheptadiene, tetracyclopentadiene, vinyl norbornene and ethylidene norbornene.

16. The formulation of claim 1 wherein the hydrosilation reaction catalyst is a platinum compound.

17. The formulation of claim 1 additionally containing an inorganic filler in an amount of up to 95% by weight.

18. The formulation of claim 1 which has been partially reacted to form a prepolymer.

19. The formulation of claim 1 wherein the polycyclic polyene is dicyclopentadiene.

20. The formulation of claim 1 additionally comprising an elastomer to improve toughness.

21. A crosslinkable carbosilane polymer formulation comprising a carbosilane polymer of the formula:

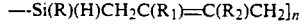

wherein R is hydrogen, an alkyl radical containing from one to four carbon atoms or an aromatic radical; $R_1$ and $R_2$ are independently hydrogen, a methyl radical or halogen; and n is an integer of at least 5, and a polyene crosslinking agent, and optionally a hydrosilation catalyst.

22. A crosslinkable carbosilane polymer formulation comprising a carbosilane random or block copolymer of the formula

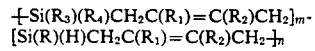

where R is hydrogen, an alkyl radical containing from one to four carbon atoms or an aromatic radical; $R_1$ and $R_2$ are independently hydrogen, a methyl radical or halogen; $R_3$ and $R_4$ are, independently, an alkyl radical containing from one to four carbon atoms or an aromatic radical; and m and n are integers of at least 5, and a polyene crosslinking agent, and optionally a hydrosilation catalyst.

23. A crosslinkable carbosilane polymer formulation comprising a carbosilane polymer of the formula

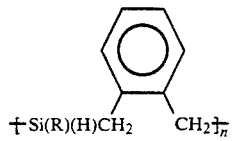

wherein R is hydrogen, an alkyl radical containing from one to four carbon atoms or an aromatic radical, and n is an integer of at least 5, and a polyene crosslinking agent, and optionally a hydrosilation catalyst.

* * * * *

UNITED STATES PATENT AND TRADEMARK OFFICE
CERTIFICATE OF CORRECTION

PATENT NO. : 5,260,377
DATED : November 9, 1993
INVENTOR(S) : Weber et al

It is certified that error appears in the above-indentified patent and that said Letters Patent is hereby corrected as shown below:

Col. 12, claim 2, line 28, delete
"-Si(R)(H)CH$_2$C(R$_1$)=C(R$_2$)CH$_2$]$_n$" and insert therefore:
-- $\dashv$Si(R)(H)CH$_2$C(R$_1$)=C(R$_2$)CH$_2$$\vdash_n$ --.

Col. 12, claim 4, line 52, delete
"-Si(R)(H)CH$_2$CH(R$_1$)CH(R$_2$)CH$_2$]$_n$" and insert therefore:
-- $\dashv$Si(R)(H)CH$_2$CH(R$_1$)CH(R$_2$)CH$_2$$\vdash_n$ --.

Col. 12, claim 5, line 67, delete "at least" and insert therefore: -- at least 5 --.

Col. 14, claim 21, line 24, delete
"-Si(R)(H)CH$_2$C(R$_1$)=C(R$_2$)CH$_2$]$_n$" and insert therefore:
-- $\dashv$Si(R)(H)CH$_2$C(R$_1$)=C(R$_2$)CH$_2$$\vdash_n$ Signed and Sealed this Twelfth Day of July, 1994

Attest:

BRUCE LEHMAN

Attesting Officer   Commissioner of Patents and Trademarks